United States Patent [19]

Andersen

[11] 4,032,371

[45] June 28, 1977

[54] METHOD OF MAKING A THERMO-ELEMENT

[75] Inventor: Niels Lervad Andersen, Nordborg, Denmark

[73] Assignee: Danfoss A/S, Nordborg, Denmark

[22] Filed: Apr. 14, 1976

[21] Appl. No.: 676,737

[30] Foreign Application Priority Data

Apr. 30, 1975   Germany .......................... 2519338

[52] U.S. Cl. .................................. 148/171; 148/1.5; 148/188; 147/177; 252/62.3 C; 106/44; 423/439; 423/345

[51] Int. Cl.² ........................................ H01L 21/208

[58] Field of Search ............... 252/62.3 T; 148/171, 148/188, 1.5, 177; 252/62.3 C; 106/44; 423/439, 345

[56] References Cited

UNITED STATES PATENTS

| | | | |
|---|---|---|---|
| 2,431,326 | 11/1947 | Heyroth | 423/345 X |
| 2,938,807 | 5/1960 | Andersen | 423/345 X |
| 3,171,871 | 3/1965 | Watson et al. | 423/345 X |
| 3,308,356 | 3/1967 | Rutz | 148/177 X |
| 3,679,471 | 7/1972 | Wyss | 423/345 X |

*Primary Examiner*—G. Ozaki

[57] ABSTRACT

The invention relates to a method of making a thermo-element having two sections with two electric conductor materials of different thermo-electric properties connected in series. The method involves forming a porous base body with interconnected pores and introducing p and n type conductor materials respectively into the pores of the two sections. The introduction of the two conductor materials involves forming one or two melts of molten silicon which travels through the body via a capillary action. Doping material is introduced in the melt material or directly into the body where it is picked up by the molten material which is subjected to the capillary action. The two conductor materials results by reason of the capillary action producing a reactive sintering between the graphite and the doped silicon melt.

10 Claims, 6 Drawing Figures

METHOD OF MAKING A THERMO-ELEMENT

The invention relates to a method of making a thermo-element comprising two electric conductor materials of different thermo-electric properties connected in series, particularly a p-type semi-conductor and an n-type semi-conductor, to a thermo-element made thereby and to the use of the latter.

Thermo-elements serve to convert heat into electrical energy but can also produce heat or coldness when supplied with electrical energy.

Thermo-elements were originally made from two different metals soldered to each other at the junction. The thermal stress created at this soldered position on heating is larger, the wider the two metals are spaced from one another at the thermo-electric stress series and increases with the higher temperature of the hot soldered position. However, this soldered position is mechanically and thermally sensitive, particularly when the thermo-element is subjected to elevated temperatures or vibrations.

In more recent times thermo-elements have become known in which the two conductor materials consist of a p-type semi-conductor and an n-type semi-conductor. Suitable semi-conductor materials are for example lead tellurite, germanium tellurite and bismuth tellurite. However, in this case the mechanical and electrical junction by soldering or the like presents yet greater difficulties. Particularly multi-part thermo-elements have become known in which a semi-conductor cylinder was held between two metalic cylinders and the junctions were bridged by electrolytically applied metal collars, the junction between the columns thus made being produced by a metallic bridge.

The invention is based on the problem of providing a method of the aforementioned kind, with the aid of which it is possible to make in a simple manner thermo-elements which have a very stable mechanical and electrical connection between the two conductor materials, can be designed as a semi-conductor thermo-element and can be made in a multiplicity of shapes.

This problem is solved according to this invention in that a porous base body is made with interconnected pores and a molten material is introduced in the pores, by which at least one component of the first conductor material is supplied to a first zone and at least one component of the second conductor material is supplied to a second zone.

In this process the base body forms a one-piece supporting skeleton of which the pores are filled with a solidified melt. Consequently one obtains a very compact body having a high mechanical strength. The different conductor properties are introduced with the molten material whilst maintaining the one-piece construction of the base body. No soldered or other connection is therefore required to keep these conductor materials in positive electrical contact by means of direct contact with a neutral intermediate conductor or, as is preferred, by direct contact with one another. The shape of the thermo-element can be selected at will because the base body can be given any desired shape.

A particularly preferred method consists in that the porous base body is made first and then the molten material is supplied to the pores by capillary suction from a melt. The capillary action conveys the material of the melt into the pores with extreme reliability so that the latter become filled substantially completely and a good electrical contact is produced at the position of contact between the two conductor materials within the pores.

Generally it is sufficient to dip only one end of the base body in the melt and leave it therein until the melt has penetrated into the pores of the first or second region.

As the molten material, one can use the molten first or second conductor material.

Another possibility is that the pores are partially filled with at least one component of the conductor material, the molten material contains at least a second component of the conductor material, and these components are reacted in the pores to form the conductor material. This is, for example, favourable with a multitude of semi-conductors as conductor material, particularly if the semi-conductor itself, i.e. the reaction product, has a higher melting point than at least the second component.

Instead, it is also possible for the base body to contain at least a first component of the conductor material, the molten material to contain at least a second component of the conductor material, and these components to be reacted in the base body. In this way the conductor materials are formed by reacting at least a portion of the material of the base body.

In a preferred embodiment it is ensured that, when using a p-type semi-conductor and an n-type semi-conductor as conductor materials, a p-doping agent and an n-doping agent are fed together with the molten material into the pores. Since the doping agent is brought into position only by the molten material, one obtains two cleanly separated semi-conductors of different conductivity type in the base body but producing a reliable contact face between one another. The base body can be brought into contact with a melt containing doping agents. The base body could also firstly be treated with doping agents and then brought into contact with the melt. For example, the doping agents may already by introduced to the base body during manufacture of the latter.

If a p-doping agent is provided at one end of the base body and an n-doping agent at the other, and both ends are then brought into contact with the melt, the different doped melts will rise in the base body from opposite sides until they touch.

It is also possible for the one doping agent to be provided in the centre and the other at the end of the base body and for only the last-mentioned end to be brought into contact with the melt. In this case, although the melt rising through the entire base body contains the last-mentioned doping agent, the first-mentioned doping agent predominates in the centre of the base body so that in the end effect two differently doped semi-conductors are present.

If the different conductivity of the semi-conductors is produced by the doping agents, the same melt may be used to produce both conductor materials.

In a preferred embodiment, it is ensured that the base body is made from $\alpha$ or $\beta$-SiC held together by a binder and having its pores partially filled with carbon, a melt comprising Si is used, and the two conductor materials are produced in the pores by a sintering reaction with the addition of doping agents. The carbon can in this case be added in the form of graphite or produced in the base body by the thermal decomposition of a phenol resin or the like. The reactive sintering of Si and C in a raw material of α-SiC is known per se (DT-OS 2,310,148).

Another possibility is that the base body is made from carbon grains, such as graphite granules, held together by a binder, that a melt comprising Si is used, and that the two conductor materials are produced in the base body by a sintering reaction with the addition of doping agents. In this way the base body is at least partially reacted to form p or n-conductive β-SiC.

The usual additives may be used as doping agents, for example, aluminium as the p-type agent and antimony as the n-type doping agent in the case of SiC.

It is also favorable if so much molten Si is supplied but, after the sintering reaction, free Si remains in the base body, and that the Si is etched away in a region between the ends of the base body. The Si remaining at the ends considerably facilitates the application of the connecting contacts. In addition, the specific resistance is reduced so that the temperature loading on the cold connecting members is smaller.

Further, a U-shaped base body may be made and dipped into the melt with both ends at the same time. This reduces the production time.

The thermo-element can also be made in a different manner. For example, the materials of the base body and the two conductor materials may be mixed with one another and subjected to a thermal and pressure treatment in a mould. This causes the base body to sinter together, whilst the conductor materials melt and substantially completely fill out the pores.

A thermo-element made according to this method is particularly characterised by a porous base body with interconnected pores filled with the first conductor material in a first zone end with the second conductor material in a second zone.

Similarly, a thermo-element may be characterised by a porous base body consisting substantially of the first conductor material in a first zone and substantially of the second conductor material in a second zone and comprising interconnected pores which are filled with a solidified melt containing one component of these conductor materials.

In a preferred embodiment, the porous base body consists of α or β-SiC and the conductor materials consist of p or n-doped β-SiC. The doped silicon carbide forms two semi-conductors with very high thermal stresses. Approximately +300 $\mu$ V/° C is obtained for the n-type and −300 $\mu$ V/° C for the p-type, so that the entire thermo-element gives a thermal stress of about 600 $\mu$ V/° C. By incorporating the doped SiC in the pores of the base body, one first of all has the possibility of keeping the two SiC semi-conductors in a fixed mechanical connection and in secure electrical contact with one another. This thermo-element can also be subjected to very high temperatures up to over 2000° C. Further, it may be used in a corrosive atmosphere.

However, the material of the base body may employ other substances, for example glass, boron, boron nitrite, aluminium oxide or other materials which, when the conductor materials are located in the pores, effect adequate insulation and will not undergo undesirable deformation under the manufacturing and operating conditions. The conductor materials may also be chosen at will, for example from the metals and semi-conductors hitherto used for thermo-elements.

The selected shape of the thermo-element can also be readily adapted to the desired conditions of use. It is generally very desirable if the porous base body and thus the thermo-element is of rod shape. The length of the rod ensures that the hot junction has little thermal influence on the cold connecting positions.

By reason of the freedom of choice for the shape, the thermo-element may also be given a shape that makes it suitable as a constructional element for temperature-loaded constructions. The constructional element will then also serve to measure the temperature in the region of this constructional element. For example, the aforementioned silicon carbide thermo-elements may be used as constructional components in jet engines, i.e. as wall linings or as a supporting column in the jet passage.

The invention will now be described in more detail with reference to the drawing in which various embodiments are diagrammatically illustrated. In the drawings.

Figure 1:
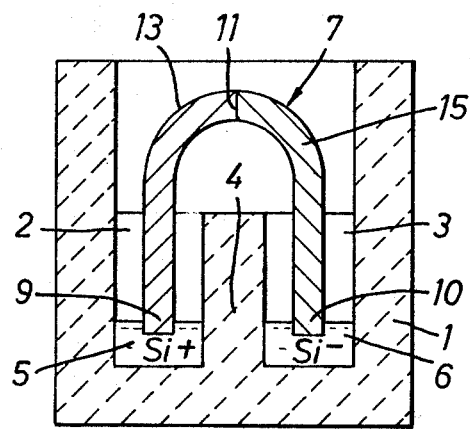
FIG. 1 shows a thermo-element in a crucible at the end of production.
Figure 2:
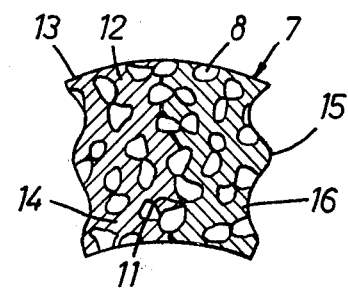
FIG. 2 shows a cross-section in the region of the contact zone between the two conductor materials.

A crucible 1 contains two chambers 2 and 3 separated from one another by a wall 4. A melt 5 of liquid Si having aluminium added to it as p-type doping agent is disposed in the chamber 2. The chamber 3 contains a melt 6 of liquid Si having antimony added to it as n-type doping agent. These melts are held at a temperature of about 1600° C.

A base body 7 in the form of a U-shaped rod is formed from α-SiC grains 8 and graphite grains with the addition of binding agents. A structure is obtained in which pores remain between the SiC grains 8, the pores being only partially filled with graphite grains so that there is a residual porosity. This base body 7 has been simultaneously dipped with its end 9 in the melt 5 and its end 1C in the melt 6.

By reason of the capillary action of the porous base body 7, doped liquid silicon rises in both limbs of the base body 7 until the two differently doped silicon portions meet one another along the contact surface 11. During rising, the silicon reacts with the carbon to form β-SiC with a simultaneous increase of the temperature up to 2300° C ('reactive sinerting'). One thereby obtains in the pores 12 the zone 13 of a first conductor material in the form of positively doped SiC, whilst in the pores of the second zone 15 there is produced a second conductor material 16 in the form of negatively doped SiC. Both conductor materials 14 and 16 are rigidly interconnected by reason of the sintering and are in electrical contact with one another along the contact surface 11. If the region of the contact surface 11 is subjected to a high temperature and the two ends 9 and 10 to a low temperature, a thermal stress will result.

Figure 3:
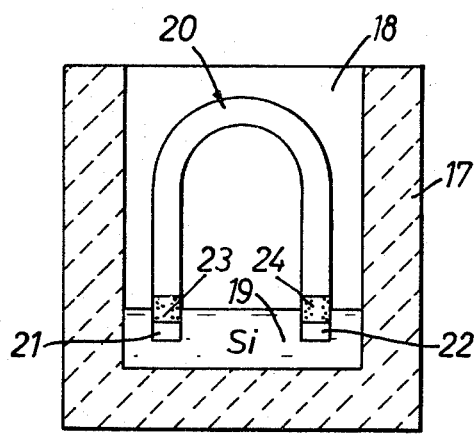
FIG. 3 shows a base body directly after insertion in a crucible.

In the embodiment according to FIG. 3, only a single chamber 18 is provided in a crucible 17 containing a single melt 19 of liquid undoped silicon. A base body 20 in the form of a U-shaped bent rod consisting of a mixture of SiC and C is dipped with both ends 21 and 22 into the melt 19. During manufacture of the base body 20, both ends had already been provided with a p doping agent 23 and an n doping agent 24, for example aluminium and antimony, respectively. If, now, the liquid Si rises in the limbs of the base body 20, it is doped whilst passing through the doping zones so that in the end effect a similar thermo-element is produced as in the FIG. 1 embodiment.

Figure 4:
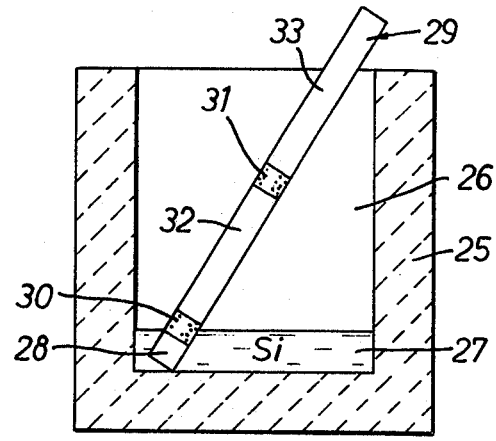
FIG. 4 shows another embodiment of a base body directly after insertion in a cricible.

In FIG. 4, a single chamber 26 in a crucible 25 is provided with a single melt 27 of undoped silicon. Into this there is dipped one end 28 of a base body 29 in the form of a straight rod having a similar composition to that of the rods 7 and 20. This base body contains a p doping agent 30 at the end 28 and a larger quantity of an n doping agent 31 in the centre. If, now, the silicon rises in the base body 29, a positively doped SiC semi-conductor is formed in the lower zone 32 whilst a negatively doped SiC semi-conductor is formed in the upper zone 33 by the predominence of the n doping agent.

Figure 5:
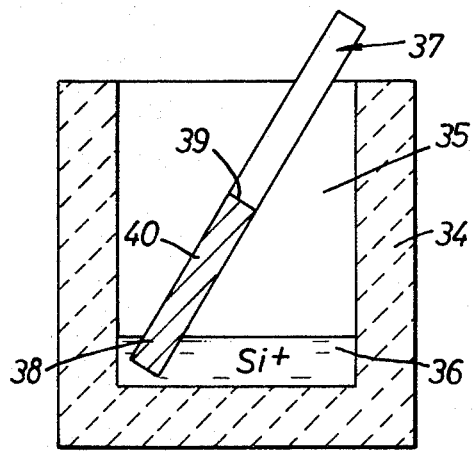
FIG. 5 shows a further base body with the first conductor material in a first crucible.

FIG. 5 shows a crucible 34, the interior 33 of which is filled with a melt 36 of positively doped silicon. A base body 37 in the form of an elongated rod has been placed in this melt and has the same composition as the previously described base bodies. This base body 37 is dipped in the melt 36 with its end 38 until the silicon has reached the level 39. In this way the zone 40 is provided with a positively doped SiC semi-conductor. The base body 37 is then introduced to a crucible 41 of which the interior 42 is provided with a melt 43 of negatively doped silicon. The end 44 of the base body 37 is dipped into this melt 43 and one waits until the silicon has reached the level 39. The second zone 45 will then be filled with a negatively doped SiC semi-conductor.

Figure 6:
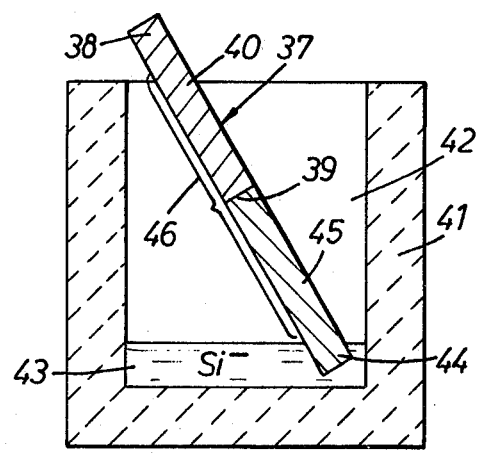
FIG. 6 shows the FIG. 5 base body with both conductor materials in a second crucible.

In all embodiments one may proceed so that the quantity of silicon rising under capillary action is larger than that required for the reactive sintering with the carbon. For this reason, free Si remains in the thermo-element after the reactive sintering. This free Si is removed by etching in the zone 46 between the ends 38 and 44 (FIG. 6). Etching can, for example, be effected with a mixture of nitric acid and hydrogen fluoride. At the ends 38 and 44, which remain colder during operation, a connecting contact can then be applied comparatively easily, for example by applying a metal which, together with the free Si, forms a eutectic alloy that is substantially ohmically conductive. For example, aluminium, silver, gold or antimony are suitable for this.

In all the embodiments one can also make the base body 7, 20, 29 or 37 from graphite granules 8 held together by a binding agent. When doped liquid silicon rises in such a base body, reactive sintering between the graphite granules of the base body and the silicon produces β-SiC with p or n doping, so that the conductor materials are formed substantially by the base body.

To produce other doped semi-conductors one can use in the melt a material other than silicon, for example titanium, the composition of the base body being necessarily selected accordingly. Similarly, one can use a base body of porous glass and dip it in melts of liquid metal.

I claim:

1. A method of making a thermo-element of the type having two sections of different thermo-electric properties connected in series comprising the steps of forming a porous base body with interconnected pores, introducing a molten p-type conductor material into said pores of one of said sections, and introducing a molten n-type conductor material into said pores of the other of said sections.

2. A method of making a thermo-element according to claim 1 including the step of forming a melt of molten material, said introducing of said materials being done by capillary action from said melt.

3. A method of making a thermo-element according to claim 2 including the step of introducing a doping agent into said melt.

4. A method of making a thermo-element according to claim 3 including the step of forming said body with α - SiC and graphite grains and said melt with molten silicon, said capillary action producing reactive sintering between said graphite and said silicon.

5. A method of making a thermo-element according to claim 2 wherein said body is U-shaped and two quantities of said melt in adjacent chambers are provided, and the steps of introducing p and n doping agents respectively into said two quantities of said melt.

6. A method of making a thermo-element according to claim 2 wherein said body is made with a mixture of graphite and a carbide from the group of α- and β-SiC held together with a binder, said melt being heated Si and said conductor materials being formed by a sintering reaction.

7. A method of making a thermo-element according to claim 2 wherein said introducing of said molten material includes the step of dipping the end of at least one of said sections into said melt.

8. A method of making a thermo-element according to claim 7 including the step of introducing a doping agent into said body.

9. A method of making a thermo-element according to claim 7 including the steps of introducing p and n doping agents into opposite ends of said body.

10. A method of making a thermo-element according to claim 7 including the steps of introducing p and n doping agents at one end and at the midportion of said body, said dipping step involving the dipping of said one end into said melt.

* * * * *